United States Patent [19]
Yamazaki

[11] Patent Number: 5,478,777
[45] Date of Patent: Dec. 26, 1995

[54] METHOD OF MAKING A SEMICONDUCTOR PHOTOELECTRIC CONVERSION DEVICE HAVING A CRYSTALLINE I-TYPE LAYER

[75] Inventor: Shunpei Yamazaki, Tokyo, Japan

[73] Assignee: Semiconductor Energy Laboratory Co., Ltd., Kanagawa, Japan

[21] Appl. No.: 310,375

[22] Filed: Sep. 22, 1994

Related U.S. Application Data

[62] Division of Ser. No. 189,996, Feb. 1, 1994, abandoned, which is a continuation of Ser. No. 989,491, Dec. 12, 1992, abandoned, which is a division of Ser. No. 701,885, May 17, 1991, abandoned, which is a division of Ser. No. 536,474, Jun. 12, 1990, Pat. No. 5,045,482, which is a division of Ser. No. 303,995, Jan. 30, 1989, Pat. No. 4,950,614, which is a continuation of Ser. No. 830,175, Feb. 18, 1986, abandoned, which is a division of Ser. No. 733,738, May 14, 1985, abandoned.

[30] Foreign Application Priority Data

May 15, 1984 [JP] Japan ..................................... 59-97318
May 15, 1984 [JP] Japan ..................................... 59-97319
May 15, 1984 [JP] Japan ..................................... 59-97320

[51] Int. Cl.$^6$ ................................................ H01L 21/26
[52] U.S. Cl. ..................... 437/173; 437/4; 437/174; 437/233; 437/942; 437/967; 136/258
[58] Field of Search ........................... 437/4, 173–174, 437/233, 942, 967; 136/258 PC

[56] References Cited

U.S. PATENT DOCUMENTS

| | | | |
|---|---|---|---|
| 4,253,882 | 3/1981 | Dalal | 357/2 |
| 4,272,641 | 6/1981 | Hanak | 136/249 |
| 4,316,049 | 2/1982 | Hanak | 136/244 |
| 4,379,943 | 4/1983 | Yang et al. | 136/249 |
| 4,387,265 | 6/1983 | Dalal | 136/249 |
| 4,433,202 | 2/1984 | Maruyama et al. | 257/458 |
| 4,460,670 | 7/1984 | Ogawa et al. | 430/57 |
| 4,517,269 | 5/1985 | Shimizu et al. | 430/57 |
| 4,536,607 | 8/1985 | Wiesmann | 136/249 |
| 4,539,431 | 9/1985 | Moddel et al. | 136/258 |
| 4,591,892 | 5/1986 | Yamazaki | 357/30 |
| 4,719,501 | 1/1988 | Nakagawa et al. | 257/64 |
| 4,777,534 | 10/1988 | Yaniv et al. | 357/30 K |
| 4,814,842 | 3/1989 | Nakagawa et al. | 257/65 |
| 4,950,614 | 8/1990 | Yamazaki | 437/5 |
| 5,045,482 | 9/1991 | Yamazaki | 437/3 |

FOREIGN PATENT DOCUMENTS 59-61076  4/1984  Japan ..................................... 136/261

OTHER PUBLICATIONS

Article by Charles Magee and David E. Carlson entitled "Investigation of the Hydrogen and Impurity Contents of Amorphous Silicon by Secondary Ion Mass Spectrometer" dated Jan., 1980.

*Primary Examiner*—Aaron Weisstuch
*Attorney, Agent, or Firm*—Sixbey, Friedman, Leedom & Ferguson; Gerald J. Ferguson, Jr.; Stuart J. Friedman

[57] ABSTRACT

A method for forming a semiconductor material involves forming an i-type non-single crystalline layer on a substrate and crystallizing the semiconductor material by irradiation with a light having a wavelength in the range of 250 to 600 nm. Desirably, the crystals of the semiconductor material extend in column form approximately perpendicular to the substrate. Preferably, the i-type layer is doped with a recombination center neutralizer selected from hydrogen and a halogen element and the concentration of impurities forming recombination centers, such as oxygen, nitrogen, carbon, phosphorus and boron, are maintained at 1 atomic % or less.

20 Claims, 4 Drawing Sheets

METHOD OF MAKING A SEMICONDUCTOR PHOTOELECTRIC CONVERSION DEVICE HAVING A CRYSTALLINE I-TYPE LAYER

This application is a divisional of Ser. No. 08/189,996, filed Feb. 1, 1994, now abandoned, which itself was a Continuation of Ser. No. 07/989,491, filed Dec. 12, 1992, now abandoned, which was a divisional application of Ser. No. 07/701,885, filed May 17, 1992, now abandoned, which itself was a divisional of Ser. No. 07/536,474, filed Jun. 12, 1990, now U.S. Pat. No. 5,045,482, which is a divisional of Ser. No. 07/303,995, filed Jan. 30, 1989, now U.S. Pat. No. 4,950,614, which is a continuation of Ser. No. 06/830,175, filed Feb. 18, 1986, now abandoned, which is a divisional of Ser. No. 07/733,738, filed May 14, 1985, now abandoned.

BACKGROUND OF THE INVENTION

1. Field of the Invention

The present invention relates to a semiconductor photoelectric conversion device which has a laminate member composed of a plurality of PIN structures formed one on the other. Further, the invention pertains to a method for the manufacture of such a semiconductor photoelectric conversion device.

2. Description of the Prior Art

Heretofore a tandem type semiconductor photoelectric conversion device has been proposed which has a laminate member comprised of at least first and second PIN structures, with the first PIN structure disposed on the light impinging side of the device.

In this case, the first and second PIN structures each have such a construction that a first conductivity type (P- or N-type) non-single-crystal semiconductor layer, an I-type non-single-crystal semiconductor layer and a second conductivity type (reverse from the first one) non-single-crystal semiconductor layer are laminated in that order or in the reverse order. The I-type layers of the first and second PIN structures are doped with a recombination center neutralizer such as hydrogen or a halogen. The I-type layer of the first PIN structure disposed on the light impinging side of the device has a larger optical energy gap than does the I-type layer of the second PIN structure.

With such a tandem type semiconductor photoelectric conversion device, the I-type layers of the first and second PIN structures are excited by the incidence of light to the laminate member from the side of the first PIN structure, by which carriers, i.e. electron-hole pairs, are generated in each I-type layer, and the electrons and holes respectively flow into one of the first and second conductivity type layers, that is, the N-type layer and into the other, that is, the P-type layer, developing photo voltage.

Since the tandem type semiconductor photoelectric conversion device has a construction such that the first and second PIN structures are electrically connected in series, it is possible to convert light to electric power which has a voltage about twice as high as that obtainable with a non-tandem type semiconductor photoelectric conversion device which has one PIN structure similar to those of the above tandem type device.

In the tandem type photoelectric conversion device, the I-type layers of the first and second PIN structures are excited by the incidence of light. In this case, the I-type layers are each most sensitive to light of a wavelength corresponding to its energy gap. Letting the energy gaps of the I-type layers of the first and second PIN structures be represented by $Eg_1$ and $Eg_2$ (where $Eg_1 > Eg_2$), respectively, and the wavelengths of light corresponding to the energy gaps $Eg_1$ and $Eg_2$ by $\lambda_1$ and $\lambda_2$ (where $\lambda_1 < \lambda_2$), respectively, the I-type layer of the first PIN structure is excited most by light of the wavelength $\lambda_1$ and the I-type layer of the second PIN structure is excited most by light of the wavelength $\lambda_2$.

Accordingly, the tandem type semiconductor photoelectric conversion device has another advantage that it is able to convert light to electric power over a wider wavelength range as compared with the non-tandem type device.

In the conventional tandem type semiconductor photoelectric conversion device, however, the I-type layers of the first and second PIN structures are both formed of an amorphous semiconductor. On account of this, the mobility of carriers which are generated in the I-type layers by incidence of light thereto is lower than in the case where the I-type layers are crystallized. Further, the degree of recombination of the carriers in the I-type layers of the first and second PIN structures is higher than in the case where the I-type layers are crystallized.

Accordingly, the prior art tandem type semiconductor photoelectric conversion device possesses the defect that its photoelectric conversion rate and efficiency are both relatively low.

In the conventional tandem type semiconductor photoelectric conversion device, the first and second PIN structures have different semiconductor compositions so that the I-type layer of the first PIN structure has a larger optical energy gap than does the I-type layer of the second PIN structure. That is, for example, the I-type layer of the first PIN structure is formed of amorphous silicon, whereas the I-type layer of the second PIN structure is formed of amorphous $Si_xGe_{1-x}$ (where $0 < x < 1$).

This means that an inexpensive material cannot be used for the I-type layers of the first and second PIN structures.

Hence, the conventional semiconductor photoelectric conversion device is high in manufacturing costs. This is even more marked in the case of using amorphous silicon for the I-type layer of the first PIN structure and amorphous $Si_xGe_{1-x}$ for the I-type layer of the second PIN structure, as mentioned above. The reason for this is as follows: The I-type layer of the first PIN structure can be formed by a CVD method using silane ($SiH_4$), and the I-type layer of the second PIN structure can be formed by a CVD method using germane ($GeH^4$). Although silicon forming the silane ($SiH_4$) is available at low cost, germanium forming the germane ($GeH_4$) is costly, resulting in an increase in the manufacturing costs of the semiconductor photoelectric conversion device.

SUMMARY OF THE INVENTION

It is therefore an object of the present invention to provide a novel semiconductor photoelectric conversion device which is free from the abovesaid defects of the prior art.

Another object of the present invention is to provide a novel method for the manufacture of a semiconductor photoelectric conversion device which is free from the abovesaid defects of the prior art.

The semiconductor photoelectric conversion device of the present invention has a laminate member which is composed of at least first and second PIN structures which are laminated with the first one disposed on the light impinging side of the device, as is the case with the conventional semiconductor photoelectric conversion device described above. In this case, the first and second PIN structures each have a construction such that a first conductivity type (P- or N-type) non-single-crystal semiconductor layer, an I-type non-single-crystal semiconductor layer and a second conductivity type (opposite from the first conductivity type) non-single-crystal semiconductor layer are laminated in that order or in the reverse order as in the prior art device. The I-type layers of the first and second PIN structures are both doped with a recombination center neutralizer. The I-type layer of the first PIN structure has a larger optical energy gap than does the I-type layer of the second PIN structure.

Accordingly, the semiconductor photoelectric conversion device of the present invention possesses the advantage that it is able to convert light over a wide range of wavelength to electric power having high voltage, as is the case with the aforesaid prior art device.

According to the semiconductor photoelectric conversion of the present invention, however, the I-type layers of the first and second PIN structures are different in the degree of crystallization so that the I-type layer of the first PIN structure has a larger optical energy gap than does the I-type layer of the second PIN structure.

In this case, the I-type layer of the second PIN structure has a higher degree of crystallization than does the I-type layer of the first PIN structure. For instance, when the I-type layer of the first PIN structure is formed of amorphous semiconductor, the I-type layer of the second PIN structure is formed of a non-single-crystal semiconductor different from the amorphous semiconductor, for example, a microcrystalline or polycrystalline semiconductor, or a mixture thereof. When the I-type layer of the first PIN structure is formed of a non-single-crystal semiconductor besides the amorphous semiconductor, the I-type layer of the second PIN structure is formed of a non-single-crystal semiconductor besides the amorphous semiconductor which is more crystallized than the I-type layer of the first PIN structure. In this case, the crystallized semiconductor is grown in columnar forms extending between the first and second conductivity type semiconductor layers.

Therefore, the mobility of carriers which are created by the incidence of light in the I-type layer of at least the second PIN structure is higher than the mobility of similar carriers in the I-type layers of both the first and second PIN structures of the conventional device. This occurs especially when the crystallized semiconductor is grown in columnar forms. Moreover, the degree of recombination of the carriers in the I-type layer of at least the second PIN structure is lower than the degree of similar photo carriers in the I-type layers of both the first and second PIN structures of the prior art device.

Further, the I-type layers of both the first and second PIN structures can be formed using an inexpensive material, for example, silicon.

Accordingly, the semiconductor photoelectric conversion device of the present intention achieves a high photoelectric conversion rate and a high photoelectric conversion efficiency as compared with the conventional device. Further, the semiconductor photoelectric conversion device of the present invention, which has such advantages, can be provided at a low cost.

The semiconductor photoelectric conversion device manufacturing method of the present invention includes, as in the past, a step of forming, on a substrate having a conductive surface, a laminate member which comprises at least first and second PIN structures in each of which a first conductivity type (P- or N-type) non-single-crystal semiconductor layer, an I-type semiconductor layer doped with a recombination center neutralizer, and a second conductivity type (opposite from the first conductivity type) non-single-crystal semiconductor layer are laminated in that order or in the reverse order, and a step of forming an electrode on the laminate member.

According to the manufacturing method of the present invention, however, the substrate is transparent. In the step of forming the laminate member, the first and second PIN structures are laminated in that order. Before the formation of the electrode, or before or after the formation of the electrode depending upon whether the electrode is non-transparent or transparent, the I-type layer of the second PIN structure is crystallized by irradiation by light for annealing from the side opposite from the transparent substrate.

According to another manufacturing method of the present invention, the electrode is transparent. In the step of forming the laminate member, the first and second PIN structures are laminated in the reverse order. Before the formation of the first PIN structure, the I-type layer of the second PIN structure is crystallized by irradiation by light for annealing from the side opposite from the substrate.

According to still another manufacturing method of the present invention, the substrate and the electrode are transparent. In the laminate member forming step, the first and second PIN structures are laminated in the reverse order. The I-type layer of the second PIN structure is crystallized by irradiation by light for annealing from the side of the substrate.

The above manufacturing methods of the present invention permit easy fabrication of the semiconductor photoelectric conversion device of the present invention.

Other objects, features and advantages of the present invention will become more fully apparent from the following detailed description taken in conjunction with the accompanying drawings.

DESCRIPTION OF THE PREFERRED EMBODIMENTS

Figure 1A:
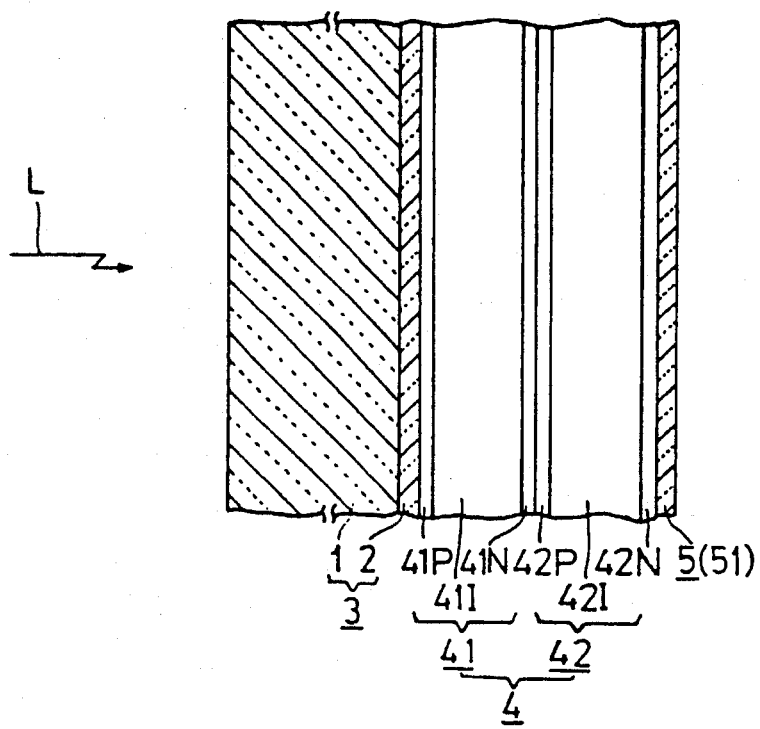
FIG. 1A is a sectional view schematically illustrating a first embodiment of the semiconductor photoelectric conversion device of the present invention.
Figure 1B:
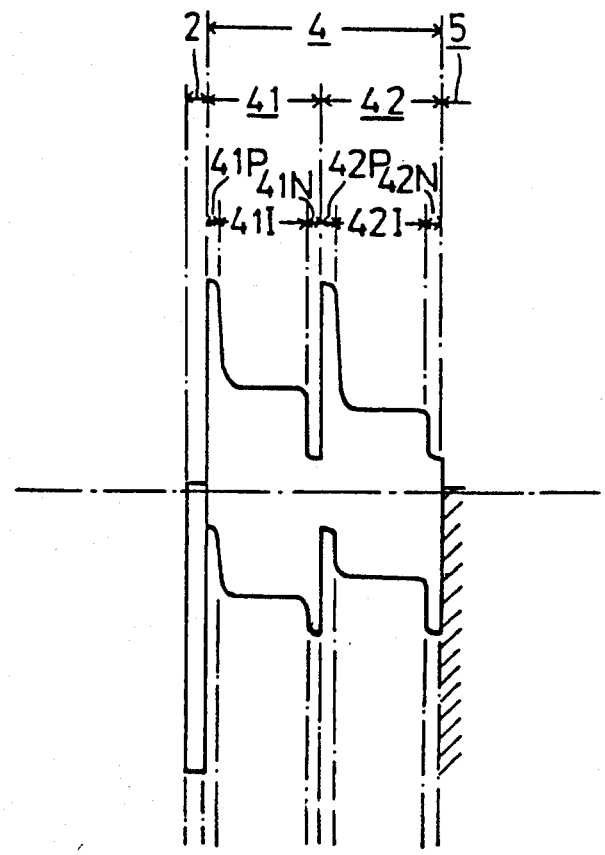
FIG. 1B is a diagram showing the first embodiment of FIG. 1A in the form of an energy band structure.

FIGS. 1A and 1B illustrate a first embodiment of the semiconductor photoelectric conversion device of the present invention, which employs a substrate 3 having a conductive surface. The substrate 3 is composed of, for example, a 1.1 mm thick transparent insulating substrate body 1 as of glass and a transparent electrode 2 of a conductive metal oxide such as tin oxide deposited thereon by means of an evaporation method.

The substrate 3 has formed thereon a laminate member 4 which comprises first and second PIN structures 41 and 42 laminated in that order.

The PIN structure 41 has such a construction that, for example, a P-type non-single-crystal semiconductor layer 41 P, an I-type-type non-single-crystal semiconductor layer 41I, and an N-type non-single-crystal semiconductor layer 41N are laminated in that order.

In this case, the P-type layer 41P is formed of amorphous semiconductor, or microcrystalline or polycrystalline semiconductor, or a mixture thereof, for instance, amorphous $Si_xC_{1-x}$ (where C<x<1), and has a thickness of, for example, 100 Å.

The I-type layer 41I is formed of amorphous silicon and has an optical energy gap of, for instance, 1.7 to 1.8 ev and a thickness of, for example, 2000 Å. Further, the I-type layer 41I is doped with hydrogen or a halogen such as fluorine, as a recombination center neutralizer, in an amount of 10 to 20 atom %. In this case, it is desired that the I-type layer 41I contain, in an amount of 1 atom % or less, an impurity which forms a recombination center, such as oxygen, nitrogen, carbon, phosphorus, or boron.

The N-type layer 41N is formed of an amorphous, microcrystalline, or polycrystalline semiconductor or a combination thereof, for instance, microcrystalline silicon, and it has a thickness of, for example, 400 Å.

The PIN structure 42 has such a construction that a P-type non-single-crystal semiconductor layer 42P, an I-type non-single-crystal semiconductor layer 42I, and an N-type non-single-crystal semiconductor layer 42N are laminated in that order, as is the case with the PIN structure 41.

The P-type layer 42P of the PIN structure 42 is formed of the same semiconductor as that of the P-type layer 41 P of the PIN structure 41 and has a thickness of, for instance, 1 to 200 Å.

The I-type layer 42I is formed of the same silicon as that used for the I-type layer 41I of the PIN structure 41 and has a thickness of, for example, 600 Å. In this case, however, the silicon used for the I-type layer 42I is microcrystalline or polycrystalline, for instance, microcrystalline. Accordingly, the I-type layer 42I has an optical energy gap (for instance, 1.4 to 1.6 eV) smaller than that (1.7 to 1.8 eV) of the I-type layer 41I formed of amorphous silicon as shown FIG. 1B. Moreover, the I-type layer 42I is doped with hydrogen, or a halogen such as fluorine, as a recombination center neutralizer. In this case, the I-type layer 42I formed of microcrystalline or polycrystalline silicon is higher in the degree of crystallization than the I-type layer 41I (the degree of crystallization of which is substantially zero), and the content of the recombination center neutralizer in the I-type layer 42I is correspondingly smaller than in the I-type layer 41I.

The laminate member 4 is covered with a transparent conductive layer 51 of, for instance, a metal oxide such as indium-tin oxide, as an electrode 5.

A description will now be given of the fabrication of the above semiconductor photoelectric conversion device by a first embodiment of the manufacturing method of the present invention.

The manufacture starts with the preparation of the substrate 3 having a conductive surface, described previously in respect of FIGS. 1A and 1B.

On the substrate 3 there is formed a PIN structure (hereinafter identified by 41', though not shown) which will ultimately form the aforementioned PIN structure 41. The PIN structure 41' has the construction that a P-type layer, an I-type layer, and an N-type layer (hereinafter identified by 41P', 41I' and 41N', though not shown), which correspond to those P-type, I-type, and N-type layers 41P, 41I, and 41N of the PIN structure 41, are laminated in that order.

The P-type layer 41P' is formed in a reaction chamber by means of such, a known CVD method as a low temperature CVD, photo CVD, plasma CVD or like method, using a semiconductor raw material gas(es) and a P-type impurity material gas such as diborane ($B_2H_6$). The I-type layer 41I' is formed in the same reaction chamber as that for the P-type layer 41P' or in a separate chamber by means of the abovesaid CVD method using the semiconductor raw material gas and, if necessary, hydrogen as the recombination center neutralizer. The N-type layer 41N' is formed in the same reaction chamber as the that for the P-type and/or I-type layer or in a separate chamber by means of the above said CVD method using a semiconductor raw material gas(es) and an N-type impurity material gas such as phosphine ($PH_3$).

After the formation of the PIN structure 41' on the substrate 3, another PIN structure (hereinafter identified by 42', though not shown) which will ultimately constitute the aforementioned PIN structure 42 is formed on the PIN structure 41'. The PIN structure 42' has a construction such that P-type, I-type, and N-type layers (hereinafter identified by 42P', 42I', and 42N', though not shown) which correspond to those P-type, I-type, and N-type layers 41P, 41I', and 41N of the PIN structure 41 are laminated in that order. The P-type layer 42P', I-type layer 42I', and N-type layer 42N' are formed in the same manner as P-type layer 41P', I-type layer 41I', and N-type layer 41N'. Therefore, no detailed description will be repeated.

In this way, a laminate member (hereinafter identified by 4', though not shown) is obtained which will ultimately constitute the laminate member 4 described previously with respect to FIGS. 1A and 1B. Next, the laminate member 4' is exposed to irradiation by light from the side opposite the substrate 3 for annealing. In this case, the light used for annealing is light of such a wavelength that it is absorbed by the I-type layer 42I' of the PIN structure 42' with high absorptivity. The light of such a wavelength is obtained by applying light from an ultrahigh-voltage mercury lamp to a filter for filtering out light of wavelength above 600 nm, for example, and the light thus obtained through the filter has a wavelength of, for instance, 250 to 600 nm. Further, the substrate 3 and the laminate member 4' formed thereon are heated so that the substrate 3 and the laminate member 4' are held in the temperature range of room temperature to 400° C., for example, 210° C.

By exposing the laminate member 4' to irradiation by light for annealing, the laminate member 4 described previously with regard to FIGS. 1A and 1B is obtained.

That is, the light for annealing is mostly absorbed by the I-type layer 42I' of the PIN structure 42' to crystallize it, providing the I-type layer 42I mentioned in connection with FIGS. 1A and 1B. In this case, the crystallized semiconductor is grown in columnar form to extend between the N-type and P-type layers 42N' and 42P'. When the N-type layer 42N' of the PIN structure 42' is microcrystalline, it is scarcely or only slightly crystallized by the light for annealing of the I-type layer 42I'. At any rate, the N-type layer 42N' is obtained which is described previously in respect of FIGS. 1A and 1B. When the P-type layer 42P' is formed of $Si_xC_{1-x}$, it is hardly or only slightly crystallized by the light for annealing of the I-type layer 42I'. Anyhow, the P-type layer 42P' described previously in connection with FIGS. 1A and 1B is obtained. Similarly, the N-type layer 41N' is also scarcely crystallized, and the I-type and the P-type layers 41I' and 41P' are not substantially crystallized. Accordingly, the N-type, I-type, and N-type layer 41N, 41I, and 41P described with respect to FIGS. 1A and 1B are obtained.

Next, the transparent conductive layer 51 which forms the electrode 5, described previously in respect of FIGS. 1A and 1B, is formed on the laminate member 4 by a known method, for example, an electron beam evaporation method, obtaining the semiconductor photoelectric conversion device of the present invention shown in FIGS. 1A and 1B.

In the above-described embodiment, the laminate member 4 is formed on the substrate 3 prior to the formation of the electrode 5.

The semiconductor photoelectric conversion device of the present invention, shown in FIGS. 1A and 1B, can be manufactured by the following second embodiment of the manufacturing method of the present invention as well.

In this case, the above-described laminate member 4' is formed on the substrate 3 and the transparent electrode 5 is formed on the laminate member 4' as described above, after which the laminate member 4' is exposed to irradiation by light for annealing through the transparent electrode 5 with the substrate 3 held at the aforementioned temperature.

According to the first embodiment of the semiconductor photoelectric conversion device of the present invention described above with respect to FIGS. 1A and 1B, light L incident to the device from the side of the substrate 3 can be converted to electric power which is developed across the electrodes 2 and 5. In this case, since the I-type layer 42I of the PIN structure 42 of the laminate member 4 has a higher degree of crystallization than does the I-type layer 41I of the PIN structure 41, and since the latter has a larger energy gap than does the former, the excellent effects mentioned in the "Summary" can be produced.

The semiconductor photoelectric conversion device of the present invention, described previously in connection with FIGS. 1A and 1B, achieves such excellent characteristics as an open-circuit voltage of 1.56 V or more, a short-circuit current of 11 mA/cm$^2$, a fill factor of 62% or more and a photoelectric conversion efficiency of 10.64% or more in the case of a 1.05 cm$^2$ area.

Further, according to the embodiments of the manufacturing method of the present invention, the semiconductor photoelectric conversion device having such excellent features can easily be fabricated at low cost.

Next, a description will be given, with reference to FIG. 2, of a second embodiment of the semiconductor photoelectric conversion device of the present invention.

Figure 2:
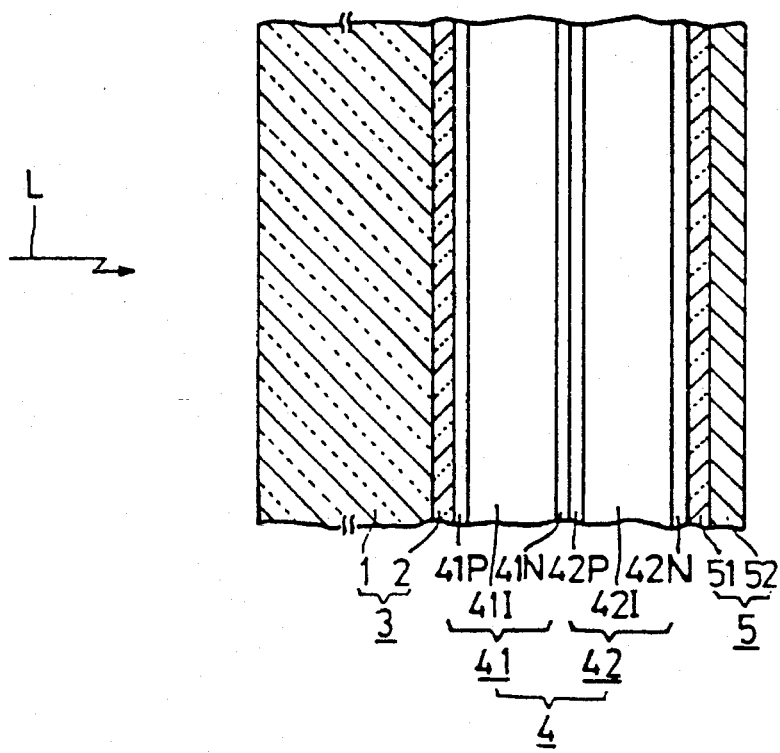
FIG. 2 is a sectional view schematically Illustrating a second embodiment of the semiconductor photoelectric conversion device of the present invention.

In FIG. 2, like parts corresponding to those in FIG. 1 are identified by the same reference numerals and will not be described in detail.

The second embodiment of the semiconductor photoelectric conversion device shown in FIG. 2 is identical in construction with the first embodiment of FIGS. 1A and 1B except that the electrode 5 is composed of the transparent conductive layer 51 and a reflecting conductive layer 52 as of aluminum is laminated thereon, whereas in the first embodiment the electrode 5 is formed by the transparent conductive layer 51 alone. Accordingly, no further detailed description will be given of the structure of this embodiment.

The semiconductor photoelectric conversion device shown in FIG. 2 can also be manufactured by forming the laminate member 4 on the substrate 3 prior to the formation of the electrode 5 as in the first embodiment described previously in connection with FIGS. 1A and 1B. This will hereinafter be referred to as the third embodiment of the manufacturing method of the present invention. Also, it is possible to manufacture the semiconductor photoelectric conversion device of FIG. 2 by the steps of forming the laminate member 4' on the substrate 3, forming on the laminate member 4' a transparent conductive layer 51 which forms the electrode 5, exposing the laminate member 4' to irradiation by light for annealing through the transparent conductive layer 51, and forming a reflecting conductive layer 52 which forms the electrode 5. This will hereinafter be referred to as the fourth embodiment of the manufacturing method of the present invention.

According to the second embodiment of the semiconductor photoelectric conversion device of the present invention and the third and fourth embodiments of the manufacturing method of the invention, it is possible to obtain such excellent effects as described previously with respect to FIGS. 1A and 1B, though not described in detail.

Next, a description will be given, with reference to FIG. 3, of a third embodiment of the semiconductor photoelectric conversion device of the present invention.

Figure 3:
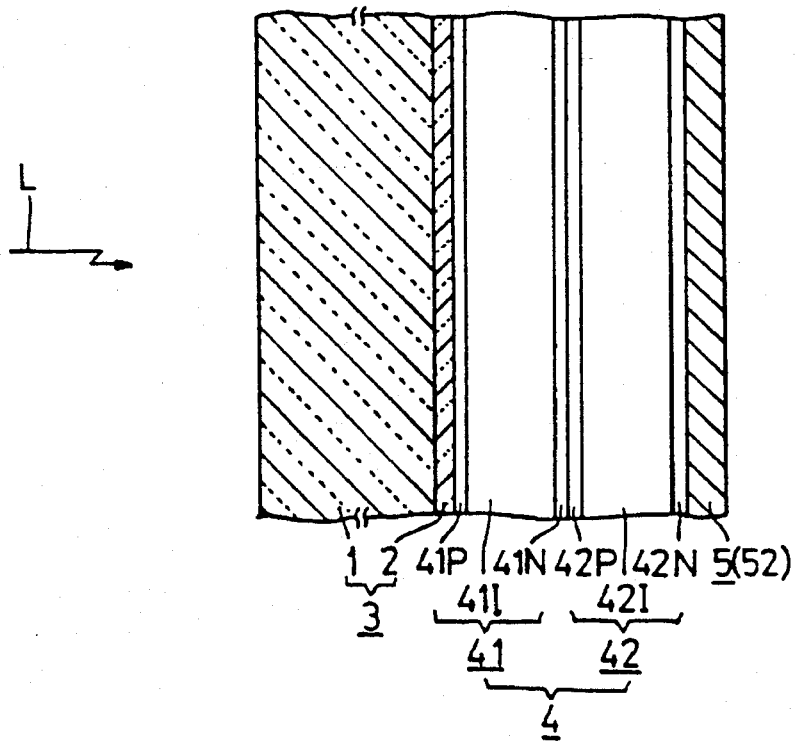
FIG. 3 is a sectional view schematically illustrating a third embodiment of :he semiconductor photoelectric conversion device of the present invention.

In FIG. 3, like parts corresponding to those in FIG. 1 are identified by the same reference numerals and will not be described in detail.

The third embodiment of the semiconductor photoelectric conversion device shown in FIG. 3 is identical in construction with the first embodiment of FIGS. 1A and 1B except that the electrode 5 is formed by the non-transparent reflecting conductive layer 52 described previously, whereas in the first embodiment the electrode 5 is formed by the transparent conductive layer 51. Accordingly, no further detailed description will be given of the structure of this embodiment.

The semiconductor photoelectric conversion device shown in FIG. 3 can also be manufactured by forming the laminate member 4 on the substrate 3 prior to the formation of the electrode 5 as in the first embodiment described previously in connection with FIGS. 1A and 1B. This will hereinafter be referred to as the fifth embodiment of the manufacturing method of the present invention.

The third embodiment of the device of the present invention and the fifth embodiment of the manufacturing method of the invention, described above, produce such excellent effects as described previously in connection with FIGS. 1A and 1B, though not described in detail.

Figure 4A:
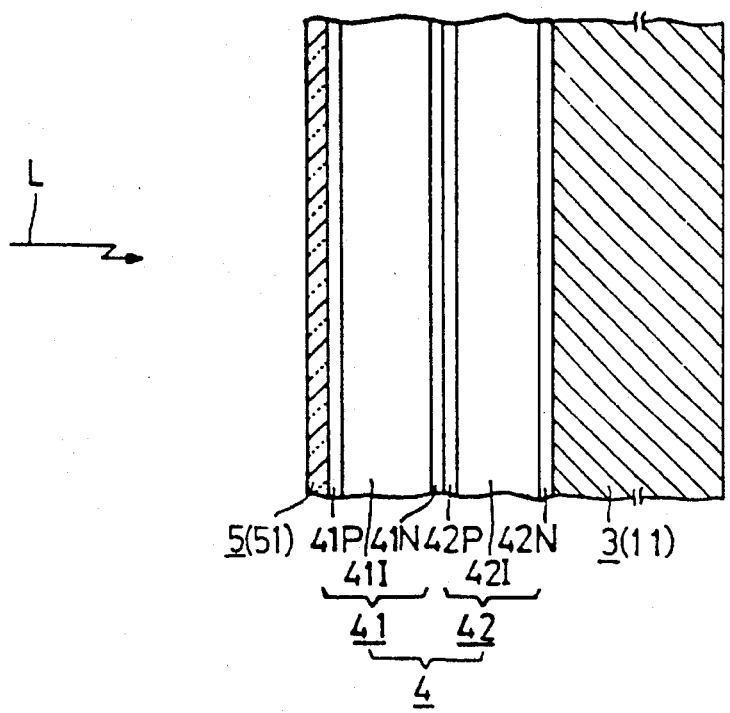
FIG. 4A is a sectional view schematically illustrating a fourth embodiment of the semiconductor photoelectric conversion device of the present invention.
Figure 4B:
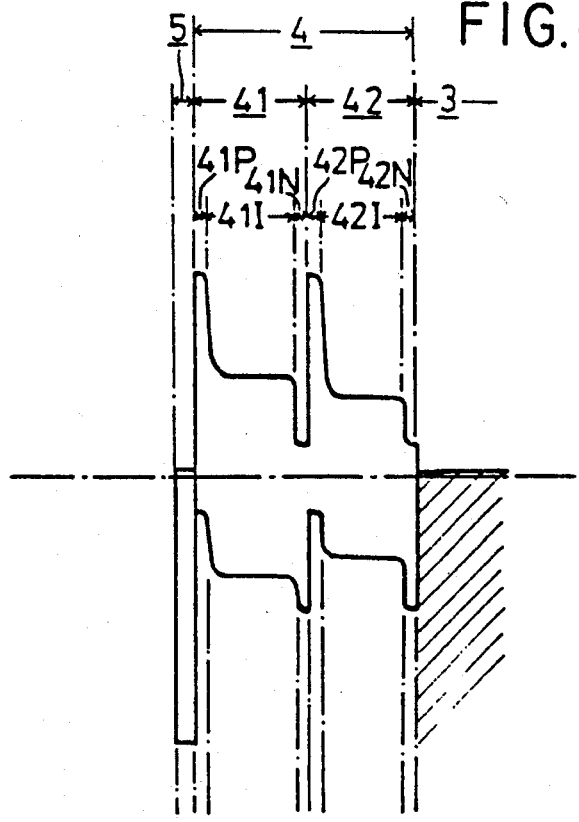
FIG. 4B is a diagram showing the fourth embodiment of FIG. 4A in the form of an energy band structure.

Turning next to FIGS. 4A and 4B, a fourth embodiment of the semiconductor photoelectric conversion device of the present invention will be described.

In FIGS. 4A and 4B, like parts corresponding to those in FIGS. 1A and 1B are identified by the same reference numerals and no detailed description will be repeated.

The fourth embodiment of FIGS. 4A and 4B is identical in construction with the first embodiment of FIGS. 1A and 1B except in the following points: First, in the first embodiment the substrate 3 is a combination of the transparent insulating substrate body 1 with the transparent conductive layer 2 formed thereon, whereas in the fourth embodiment the substrate 3 is formed only by a non-transparent conductive substrate body 11 as of stainless steel. Secondly, the PIN structures 41 and 42, which form the laminate member 4, are laminated in an order reverse from that in the first embodiment. Thirdly, the P-type, I-type, and N-type layers 42P, 42I, and 42N of the PIN structure 42 are laminated in an order reverse from that in the first embodiment. Similarly, the P-type, I-type, and N-type layers 41P, 41I, and 41N of the PIN structured 41 are also laminated in an order reverse from that in the first embodiment.

The semiconductor photoelectric conversion device shown in FIGS. 4A and 4B can be manufactured by the following sixth embodiment of the manufacturing method of the present invention which is a modified form of the first embodiment thereof.

The manufacture starts with forming on the substrate 3 a PIN structure (hereinafter identified by 42") which is similar to the structure 42' in FIGS. 1A and 1B.

Next, the PIN structure 42" is exposed to irradiation by light for annealing, as in FIGS. 1A and 1B, thereby obtaining the PIN structure 42.

Next, the PIN structure 41 is formed on the PIN structure 42, forming the laminate member 4.

Next, the electrode 5 is formed on the laminate member 4.

According to the fourth embodiment of the semiconductor photoelectric conversion device of the present invention described above with respect to FIGS. 4A and 4B, light L incident the device from the side of the electrode 5 can be converted to electric power which is developed across the substrate 3 and the electrode 5. In this case, since the I-type layer 42I of the PIN structure 42 of the laminate member 4 has a higher degree of crystallization than does the I-type layer 41I of the PIN structure 41, and since the latter has a larger energy gap than does the former, the same excellent effects as obtainable with the first embodiment of FIGS. 1A and 1B can be produced.

Further, the above sixth embodiment of the manufacturing method of the present invention permits easy and inexpensive fabrication of the semiconductor photoelectric conversion device of the present invention which produces the aforementioned excellent effects.

Figure 5:
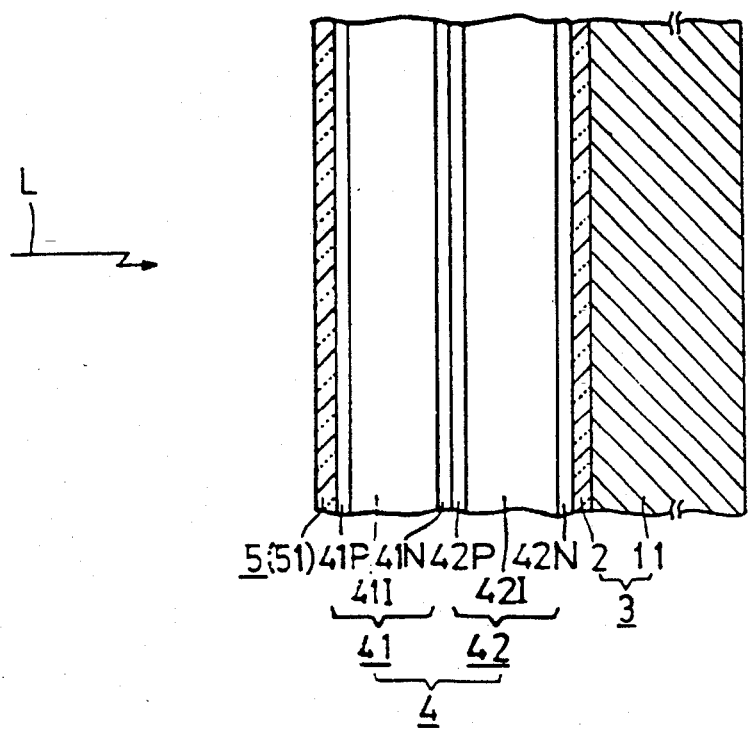
FIG. 5 is a sectional view schematically illustrating a fifth embodiment of the semiconductor photoelectric conversion device of the present invention.

Referring now to FIG. 5, a fifth embodiment of the semiconductor photoelectric conversion device of the present invention will be described.

In FIG. 5, like parts corresponding to those in FIGS. 4A and 4B are marked with the same reference numerals and no detailed description will be repeated.

The illustrated fifth embodiment is identical in construction with the fourth embodiment of FIGS. 4A and 4B except that in the latter the substrate 3 is formed by the non-transparent conductive substrate body 11 alone, whereas in this embodiment the substrate 3 is composed of the non-transparent conductive substrate body 11 and the conductive layer 2 of a metal oxide laminated thereon. Accordingly, no further detailed description will be given of this embodiment.

The semiconductor photoelectric conversion device shown in FIG. 5 can be manufactured by forming the PIN structure 42 on the substrate 3 prior to the formation of the PIN structure 41 (This will hereinafter be referred to as a seventh embodiment of the manufacturing method of the present invention.), as in the sixth embodiment of the manufacturing method described in respect of FIGS. 4A and 4B.

According to the fifth embodiment of the device of the present invention and the seventh embodiment of the manufacturing method thereof, it is possible to obtain the same excellent operational effects are obtainable with the embodiment shown in FIG. 4, though not described in detail.

Figure 6:
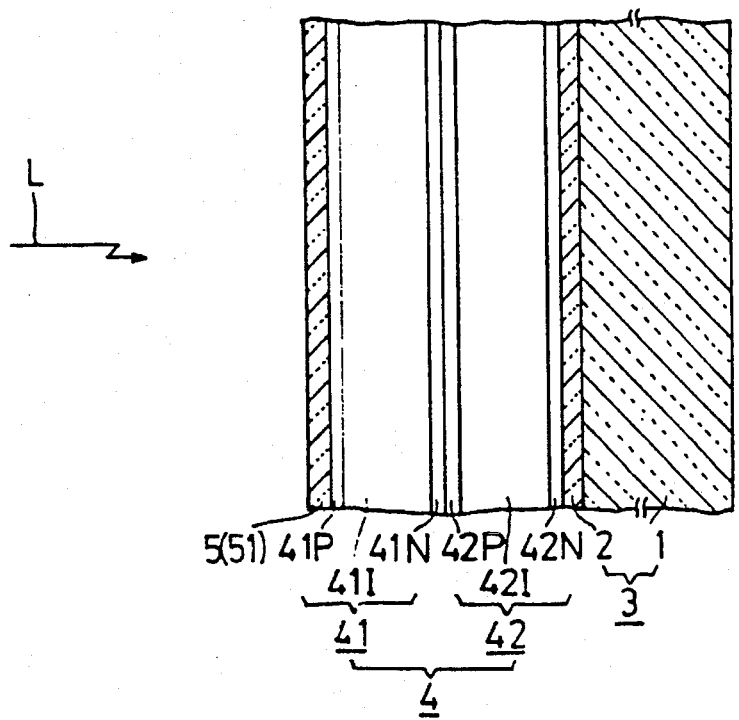
FIG. 6 is a sectional view schematically illustrating a sixth embodiment of the semiconductor photoelectric conversion device of the present invention.

Referring now to FIG. 6, a sixth embodiment of the semiconductor photoelectric conversion device of the present invention will be described.

In FIG. 6, like parts corresponding to those in FIGS. 4A and 4B are marked with the same reference numerals and no detailed description will be repeated.

The illustrated sixth embodiment is identical in construction with the fourth embodiment of FIGS. 4A and 4B except that in the latter the substrate 3 is formed by the non-transparent conductive substrate body 11 alone, whereas in this embodiment the substrate is composed of the transparent insulating substrate body 1 and the transparent conductive layer 2 of a metal oxide laminated thereon as in the first embodiment shown in FIG. 1. Accordingly, no further detailed description will be given of this embodiment.

The semiconductor photoelectric conversion device shown in FIG. 6 can be manufactured by forming the PIN structure 42 on the substrate 3 prior to the formation of the PIN structure 41 (This will hereinafter be referred to as a eighth embodiment of the manufacturing method of the present invention.) as in the sixth embodiment of the manufacturing method described in respect of FIGS. 4A and 4B.

In the manufacture of the semiconductor photoelectric conversion device shown in FIG. 6, the PIN structure 42 may also be formed by the light irradiation through the substrate 3 after the formation of the PIN structure 41 but before or after the deposition of the electrode 5 thereon (This will hereinafter referred to as a ninth embodiment of the manufacturing method of the present invention).

With the sixth embodiment of the device of the present invention and the eighth and ninth embodiments of the manufacturing method thereof, it is possible to obtain the same excellent operational effects as are obtainable with the embodiment shown in FIG. 4, though not described in detail.

The foregoing embodiments should be construed as merely illustrative of the present invention and not as limiting the invention specifically thereto. It will be apparent that many modifications and variations may be effected without departing from the scope of the novel concepts of the present invention.

What is claimed is:

1. A method for forming a semiconductor material comprising the steps of:

forming an i-type non-single crystalline semiconductor layer; and crystallizing said semiconductor material by irradiating said semiconductor material with a light having a wavelength in the range of 250 to 600 nm, where a total concentration of an impurity which forms a recombination center in said semiconductor material is 1 atomic % or less.

2. The method of claim 1 wherein said impurity comprises an element selected from the group consisting of oxygen, nitrogen, carbon, phosphorus, and boron.

3. The method of claim 1 further comprising the step of doping said semiconductor material with a recombination center neutralizer selected from the group consisting of hydrogen and a halogen element.

4. The method of claim 3 wherein said recombination center neutralizer is doped at a concentration in the range of 10 to 20 atomic %.

5. The method of claim 1 wherein said i-type non-single crystalline semiconductor material comprises silicon.

6. The method of claim 1 wherein said i-type non-single crystalline semiconductor material is formed by a plasma CVD.

7. The method of claim 1 wherein said i-type non-single crystalline semiconductor material is formed by a photo CVD.

8. A method for forming a semiconductor material comprising the steps of:

forming an i-type non-single crystalline semiconductor layer on a substrate; and crystallizing said semiconductor material by irradiating said semiconductor material with a light having a wavelength in the range of 250 to 600 nm, where crystals of said semiconductor material extend in a column form approximately perpendicular to said substrate.

9. The method of claim 8 filter comprising the step of doping said semiconductor material with a recombination center neutralizer selected from the group consisting of hydrogen and a halogen element.

10. The method of claim 9 wherein said recombination center neutralizer is doped at a concentration in the range of 10 to 20 atomic %.

11. The method of claim 8 wherein said i-type non-single crystalline semiconductor material comprises silicon.

12. The method of claim 8 wherein said i-type non-single crystalline semiconductor material is formed by a plasma CVD.

13. The method of claim 8 wherein said i-type non-single crystalline semiconductor material is formed by a photo CVD.

14. The method of claim 8 wherein said substrate is maintained at a temperature not higher than 400° C. during said crystallizing.

15. A method for forming a semiconductor material comprising the steps of:

preparing a transparent substrate;

forming an i-type non-single crystalline semiconductor layer on said substrate; and crystallizing said semiconductor material by irradiating said semiconductor material with a light having a wavelength in the range of 250 to 600 nm, wherein said light is irradiated from a side of said substrate opposite to said semiconductor material.

16. The method of claim 15 further comprising the step of doping said semiconductor material with a recombination center neutralizer selected from the group consisting of hydrogen and a halogen element.

17. The method of claim 16 wherein said recombination center neutralizer is doped at a concentration in the range of 10 to 20 atomic %.

18. The method of claim 15 wherein said i-type non-single crystalline semiconductor material comprises silicon.

19. The method of claim 15 wherein said i-type non-single crystalline semiconductor material is formed by a plasma CVD.

20. The method of claim 15 wherein said i-type non-single crystalline semiconductor material is formed by a photo CVD.

\* \* \* \* \*